(12) United States Patent
Wakaoka (10) Patent No.: US 11,421,943 B2
(45) Date of Patent: Aug. 23, 2022

(54) VAPOR CHAMBER

(71) Applicant: Murata Manufacturing Co., Ltd., Nagaokakyo (JP)

(72) Inventor: Takuo Wakaoka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 109 days.

(21) Appl. No.: 16/847,199

(22) Filed: Apr. 13, 2020

(65) Prior Publication Data

US 2020/0240719 A1 Jul. 30, 2020

Related U.S. Application Data

(63) Continuation of application No. PCT/JP2019/028978, filed on Jul. 24, 2019.

(30) Foreign Application Priority Data

Jul. 31, 2018 (JP) .............................. JP2018-143961

(51) Int. Cl.
*F28D 15/04* (2006.01)
*F28D 15/02* (2006.01)

(52) U.S. Cl.
CPC ....... *F28D 15/046* (2013.01); *F28D 15/0283* (2013.01)

(58) Field of Classification Search
CPC ................ F28D 15/046; F28D 15/0283; F28F 2270/00; F28F 2275/06; H01L 23/10
See application file for complete search history.

(56) References Cited

U.S. PATENT DOCUMENTS

| 7,186,585 | B2* | 3/2007 | Bish ........................ H01L 23/10 438/108 |
| 2003/0136551 | A1* | 7/2003 | Bakke ................. F28D 15/0233 165/104.26 |
| 2003/0173064 | A1* | 9/2003 | Ueki .................... F28D 15/0233 165/104.21 |
| 2005/0126759 | A1 | 6/2005 | Ueki et al. |

(Continued)

FOREIGN PATENT DOCUMENTS

| CN | 107764118 A | 3/2018 |
| JP | 2003254685 A | 9/2003 |

(Continued)

OTHER PUBLICATIONS

International Search Report issued for PCT/JP2019/028978, dated Oct. 8, 2019.

(Continued)

*Primary Examiner* — Tho V Duong
(74) *Attorney, Agent, or Firm* — ArentFox Schiff LLP (57) ABSTRACT

A vapor chamber that includes a housing having a first sheet and a second sheet opposing each other and having outer edges bonded to each other along a sealing portion; a working fluid sealed in the housing; and a wick disposed on an internal main surface of the first sheet opposing the second sheet. At least one of the first sheet and the second sheet includes at least one groove between the wick and the sealing portion when viewed in a cross section of the housing taken in a direction perpendicular to a direction in which the first sheet and the second sheet oppose each other.

20 Claims, 4 Drawing Sheets

(56) References Cited

U.S. PATENT DOCUMENTS

| | | | |
|---|---|---|---|
| 2005/0280162 A1 | 12/2005 | Mok et al. | |
| 2011/0232876 A1* | 9/2011 | Chang | F28D 15/0233 165/104.26 |
| 2017/0138673 A1* | 5/2017 | Aoki | H05K 7/20336 |
| 2017/0248378 A1 | 8/2017 | Koki et al. | |
| 2018/0087844 A1* | 3/2018 | Huang | F28F 9/26 |
| 2020/0025457 A1* | 1/2020 | Lin | F28F 3/12 |

FOREIGN PATENT DOCUMENTS

| | | |
|---|---|---|
| JP | 2004238672 A | 8/2004 |
| JP | 2005229049 A | 8/2005 |
| JP | 2016050713 A | 4/2016 |
| JP | 201744356 A | 3/2017 |
| WO | 2016017471 A1 | 2/2016 |

OTHER PUBLICATIONS

Written Opinion of the International Searching Authority issued for PCT/JP2019/028978, dated Oct. 8, 2019.

\* cited by examiner

VAPOR CHAMBER

CROSS REFERENCE TO RELATED APPLICATIONS

The present application is a continuation of International application No. PCT/JP2019/028978, filed Jul. 24, 2019, which claims priority to Japanese Patent Application No. 2018-143961, filed Jul. 31, 2018, the entire contents of each of which are incorporated herein by reference.

FIELD OF THE INVENTION

The present invention relates to a vapor chamber.

BACKGROUND OF THE INVENTION

Highly integrated or high-performance devices in the past few years have has increased heat generation. In addition, size reduction of these products also increases heat generation density, and thus increases the need of a heat radiation countermeasure. Such heat generation issues are more prevalent in mobile terminals such as smartphones or tablets, and the heat radiation design thereof is becoming significantly difficult. An example of a heat radiation countermeasure includes a graphite sheet, which has an insufficient heat transfer capacity.

Examples of a heat radiation countermeasure with a high heat transfer capacity include a vapor chamber, which is a plane heat pipe. The vapor chamber has a thermal conductivity of approximately several to several tens of times higher than a metal such as copper or aluminum.

As an example of a heat radiation measure including a vapor chamber, Patent Document 1 discloses a sheet-shaped member formed by sealing a wick, nonwoven fabric, and a working fluid in a sheet-shaped housing formed from metal sheets joined together.

Patent Document 1: Japanese Unexamined Patent Application Publication No. 2017-44356

SUMMARY OF THE INVENTION

In the vapor chamber described in Patent Document 1, the working fluid sealed in the housing vaporizes at a heat receiving portion thermally connected to a heat source, and condenses and liquefies at a heat dissipating portion having a low temperature. A heat transfer effect can be obtained by returning the liquefied working fluid to the heat receiving portion again by capillary attraction of the wick and the nonwoven fabric.

In the mechanism, as a precondition, the working fluid liquefied at the outer edge of the sheet-shaped housing is returned to the heat receiving portion at the center portion of the housing. However, if the distance between the metal sheets is narrowed at part of a sealing portion at which the outer edges of the metal sheets of the sheet-shaped housing are joined, the capillary attraction is enhanced at that location to hold the working fluid between the metal sheets.

In such a situation, the working fluid fails to be fed to the heat receiving portion and the center portion of the wick may be dried, or a phenomenon called dryout may occur.

Dryout prevents the working fluid from vaporizing at the heat receiving portion near the heat source, and from absorbing heat from the heat source. In this case, electronic components including a CPU may cause thermal runaway and become broken due to failure in temperature reduction of the heat source, or the surface temperature of the mobile terminal may rise above the expected temperature.

The present invention was made in view of the above circumstances, and aims to provide a vapor chamber that has high performance in circulating the working fluid from the outer edge of the sheet-shaped housing to the center portion of the housing and that is capable of preventing dryout.

The present invention provides a vapor chamber that includes a housing having a first sheet and a second sheet opposing each other and having their outer edges joined to each other along a sealing portion, a working fluid sealed in the housing, and a wick disposed on an internal main surface of the first sheet opposing the second sheet. At least one of the first sheet and the second sheet has at least one groove between the wick and the sealing portion in a cross-sectional view of the housing viewed in a direction perpendicular to the direction in which the first sheet and the second sheet oppose each other.

The present invention can provide a vapor chamber that has high performance in circulating a working fluid from an outer edge of a sheet-shaped housing to a center portion of the housing and that is capable of preventing dryout.

DETAILED DESCRIPTION OF THE PREFERRED EMBODIMENTS

A vapor chamber according to the present invention will be described, below.

The present invention, however, is not limited to the following structure, but may be changed as appropriate within the scope not departing from the gist of the present invention. A combination of two or more of individual desirable components of the present invention described below is also included in the present invention.

The following embodiments are mere examples, and components of different embodiments may be partially replaced with each other or combined together.

A vapor chamber according to the present invention is a vapor chamber having a housing including a first sheet and a second sheet opposing each other and having outer edges bonded to each other along a sealing portion; a working fluid sealed in the housing; and a wick disposed on a main internal surface of the first sheet opposing the second sheet. At least one of the first sheet and the second sheet includes a groove between the wick and the sealing portion when viewed in a cross section of the housing taken in a direction perpendicular to a direction in which the first sheet and the second sheet oppose each other.

An example of a structure of a vapor chamber will be described below with reference to FIG. 1.

Figure 1:
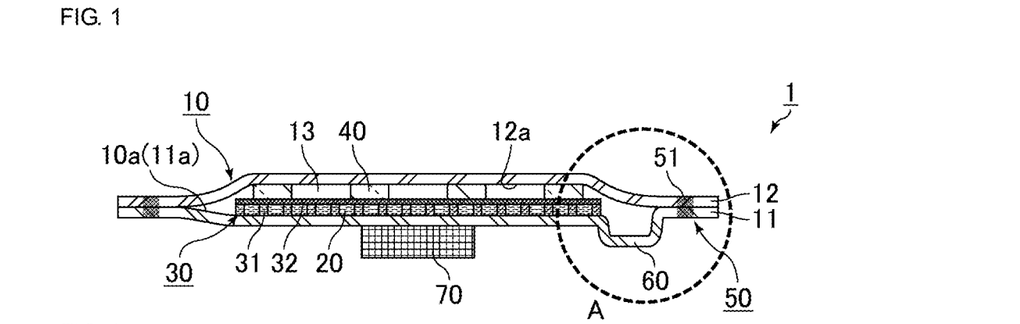
FIG. 1 is a schematic cross-sectional view of an example of a structure of a vapor chamber.

FIG. 1 is a schematic cross-sectional view of an example of a structure of a vapor chamber.

A vapor chamber 1 illustrated in FIG. 1 includes a housing 10, including a first sheet 11 and a second sheet 12 that oppose each other, a working fluid 20 sealed in the housing 10, a wick 30 disposed on a main surface 11a of the first sheet 11 (an inner wall surface 11a of the first sheet 11) opposing the second sheet 12, and multiple pillars 40 disposed on a main surface 12a of the second sheet 12 (an inner wall surface 12a of the second sheet 12) opposing the first sheet 11. The housing 10 has an internal space 13, and the first sheet 11 and the second sheet 12 are supported by the pillars 40 to secure the internal space 13.

The first sheet 11 and the second sheet 12 are joined together at their outer edges and sealed. In the vapor chamber 1 illustrated in FIG. 1, the wick 30 includes multiple projections 31, disposed at predetermined intervals on the inner wall surface 11a of the first sheet 11, and a mesh 32, disposed on the projections 31.

The projections 31 may be integrated with the first sheet 11, for example, may be formed by etching the inner wall surface 11a of the first sheet 11. Similarly, the pillars 40 may be integrated with the second sheet 12, for example, may be formed by etching the inner wall surface 12a of the second sheet 12.

A portion at which the outer edges of the first sheet 11 and the second sheet 12 are joined is a sealing portion 50. When the first sheet 11 and the second sheet 12 are both formed from a metal material and the first sheet 11 and the second sheet 12 are welded, the portion where the first sheet 11 and the second sheet 12 are welded together is referred to as a welded portion 51.

The sealing portion is a portion including the welded portion. A portion where the first sheet and the second sheet are in contact with each other without being welded together is not a welded portion, but included in the sealing portion.

The working fluid 20 stays in the wick 30 in the liquid phase. The working fluid 20 stays in the internal space 13 mostly in the gas phase (water vapor if the working fluid is water).

A heat generator 70 is disposed on the main outer surface (outer wall surface) of the first sheet 11 that is not opposing the second sheet 12.

The working fluid 20 in the wick 30 immediately above the heat generator 70 vaporizes with heat of the heat generator 70 to take the heat of the heat generator 70 away, and the vaporized working fluid moves through the mesh 32 to the internal space 13.

The vaporized working fluid 20 moves in the housing 10, and condenses and liquefies near the outer edge of the housing 10.

The liquefied working fluid 20 is absorbed by the wick 30 with capillary attraction of the wick 30, and moves in the wick 30 toward the heat generator 70 again to take heat of the heat generator 70 away.

The working fluid thus circularly moves in the housing so that the vapor chamber cools the heat generator.

In the vapor chamber according to the present invention, at least one of the first sheet and the second sheet has a groove between the wick and the sealing portion when viewed in a cross section of the housing taken in the direction perpendicular to the direction in which the first sheet and the second sheet oppose each other.

The effect exerted by the vapor chamber having a groove will be described using a comparison between a vapor chamber not including a groove and a vapor chamber including a groove.

Figure 2:
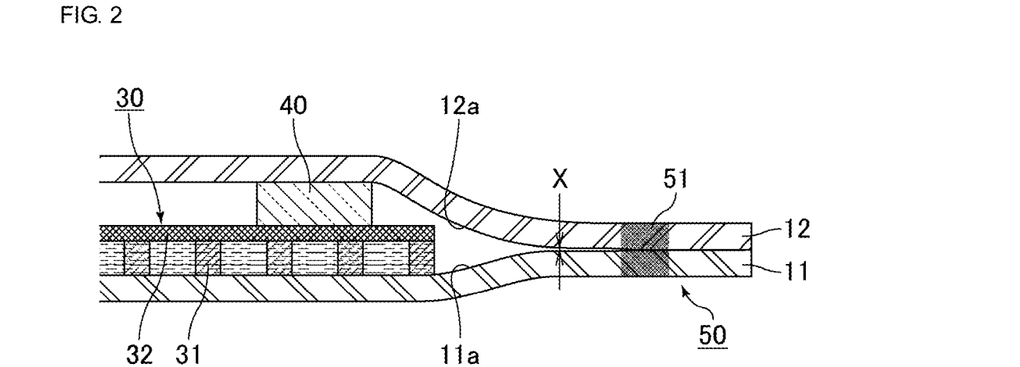
FIG. 2 is a schematic cross-sectional view of around an outer edge of a vapor chamber not including a groove.

FIG. 2 is a schematic cross-sectional view of around the outer edge of a vapor chamber not including a groove.

A vapor chamber not including a groove has, at the outer edge of the housing, a portion where the distance between the inner wall surface 11a of the first sheet 11 and the inner wall surface 12a of the second sheet 12 (distance denoted with double-pointed arrow X in FIG. 2) is narrowed. Such a portion has higher capillary attraction, and the working fluid held at such a portion is stopped without moving toward the wick. This structure thus reduces the amount of the circulating working fluid, and may cause dryout, where no working fluid stays near the heat generator 70.

Figure 3:
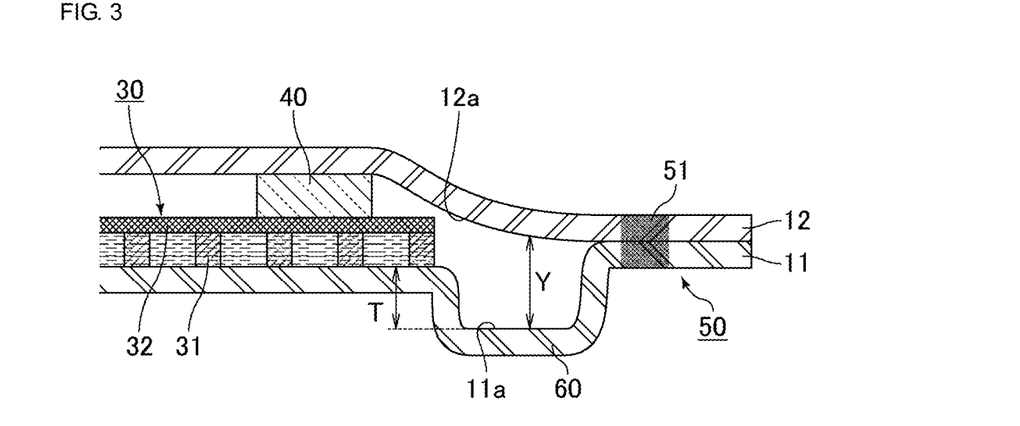
FIG. 3 is a schematic cross-sectional view of around an outer edge of a vapor chamber including a groove.

FIG. 3 is a schematic cross-sectional view of around the outer edge of the vapor chamber having a groove.

FIG. 3 shows the first sheet 11 including a groove 60.

When the vapor chamber includes the groove 60, the distance between the inner wall surface 11a of the first sheet 11 and the inner wall surface 12a of the second sheet 12 (distance denoted with double-pointed arrow Y in FIG. 3) is widened at the outer edge of the housing.

In the vapor chamber having a groove at the outer edge of the housing, the distance between the inner wall surface of the first sheet and the inner wall surface of the second sheet is widened, and the capillary attraction for the working fluid is prevented from being increased. This structure prevents the working fluid from being held between the inner wall surface of the first sheet and the inner wall surface of the second sheet. The working fluid is thus absorbed by the wick due to the capillary attraction of the wick, and can move toward the heat generator. This structure thus prevents reduction of the amount of the circulating working fluid.

Figure 4:
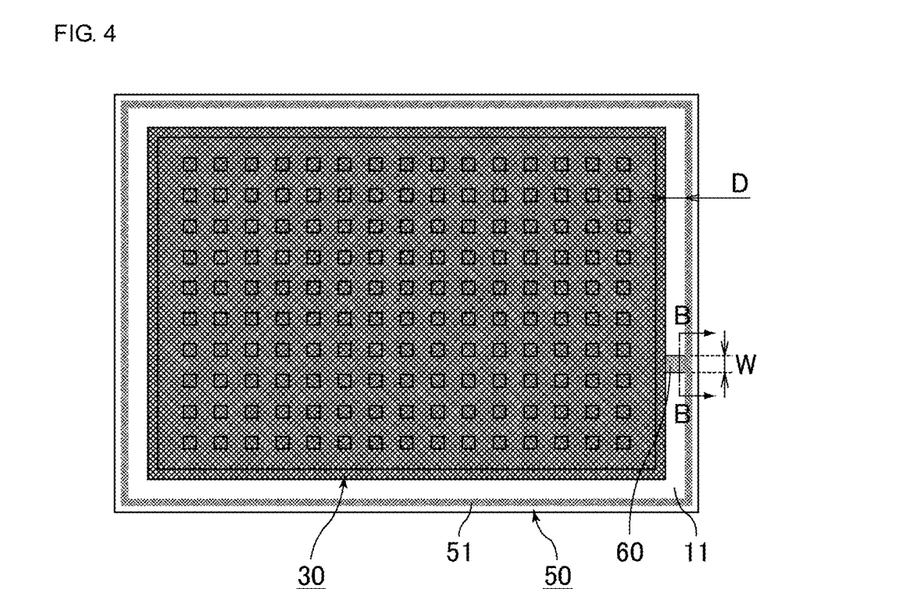
FIG. 4 is a schematic cross-sectional top view of the vapor chamber, taken along the top surface of a wick.

FIG. 4 is a schematic cross-sectional top view of the vapor chamber taken along the top surface of the wick.

FIG. 4 illustrates an example where the first sheet 11 has the groove 60 at only one portion between the wick 30 and the sealing portion 50.

Specifically, the groove 60 is in contact with the wick 30 and the welded portion 51 of the sealing portion 50. This is an example of the structure where the groove is in contact with the sealing portion when viewed in a cross section taken in the direction perpendicular to the direction in which the first sheet and the second sheet oppose each other. In this structure, the groove extends to connect the wick and the welded portion to each other.

The groove 60 illustrated in FIG. 4 is rectangular when viewed in a plan.

Although not limited to a particular one, the width (distance denoted with double-pointed arrow W in FIG. 4) of the groove preferably falls within a range of 500 μm to 700 μm.

For a groove that is not rectangular when viewed in a plan, a width may be the maximum distance in the direction denoted with the double-pointed arrow W.

The length of the groove (distance denoted with double-pointed arrow D in FIG. 4) is not limited to a particular one, but preferably falls within a range of 300 μm to 3000 μm.

For a groove that is not rectangular when viewed in a plan, a width may be the maximum distance in the direction denoted with the double-pointed arrow D.

The depth of the groove is not limited to a particular one, but preferably determined as the maximum distance from the position of the upper surface of a metal sheet assumed to have no groove to the position of the upper surface of the metal sheet of the groove (distance denoted with double-pointed arrow T in FIG. 3), within a range of 100 μm to 1000 μm.

The groove having an extremely large depth may extremely increase the thickness of the vapor chamber.

Preferably, the ratio of the width to the depth of the groove falls within the range of 0.5 to 10.0.

When the above ratio is smaller than 0.5, the capillary attraction is more easily exerted on the groove. When the above ratio is greater than 10.0, the effect of the groove is weak and the capillary attraction is highly exerted on part of the groove.

The groove preferably has a semi-circular cross-sectional shape (cross-sectional shape of the groove taken along line B-B in FIG. 4). The depth of the groove having a semi-circular cross-sectional shape is determined as the maximum depth of the groove.

Figure 5:
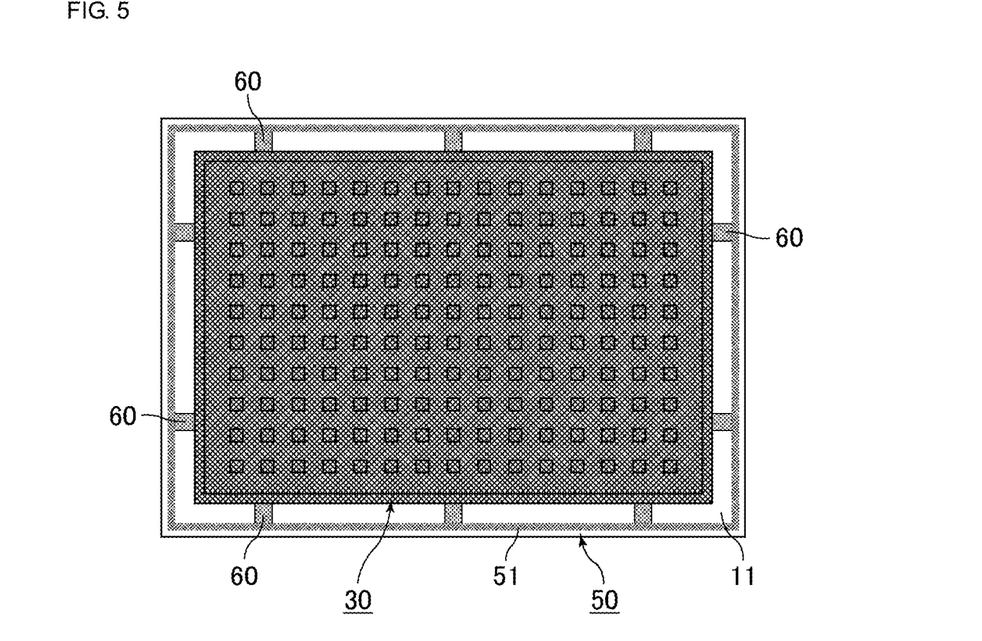
FIG. 5 is a schematic top view of an example of grooves at different positions.

FIG. 5 is a schematic top view of another example of grooves at different positions.

FIG. 5 illustrates an example where the grooves 60 are formed at all the four sides of the rectangular wick 30 in a top plan view (i.e., spaced apart around a perimeter of the wick).

The grooves formed at all the sides of the wick are preferable as they allow the working fluid to move toward the wick when the vapor chamber is in various positions (orientations).

Figure 6:
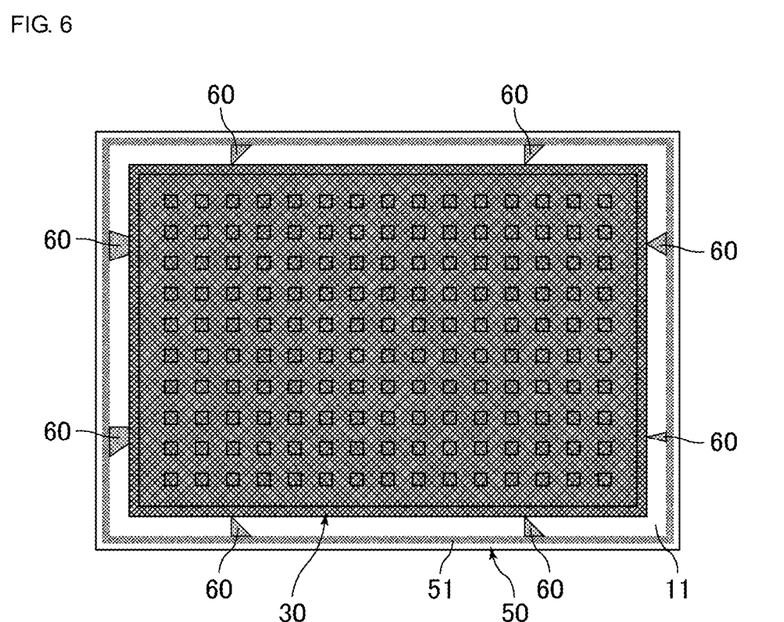
FIG. 6 is a schematic top view of another example of grooves with a different shape when viewed in a plan.

FIG. 6 is a schematic top view of another example of grooves with different shapes when viewed in a plan.

FIG. 6 illustrates the shapes of the grooves 60 with their width gradually reduced from the sealing portion 50 toward the wick 30 when viewed in a plan.

The capillary attraction is smaller at a wide portion of the groove closer to the sealing portion, so that the working fluid is less likely to be held near the sealing portion. On the other hand, the capillary attraction is larger at a narrow portion of the groove closer to the wick, so that the working fluid is attracted toward the wick.

Specifically, the grooves having a width narrowing from the sealing portion toward the wick facilitate movement of the working fluid from the sealing portion toward the wick.

Thus, the grooves may have such shapes when viewed in a plan.

FIG. 6 illustrates the grooves with shapes, as an example when viewed in a plan, of triangles (an equilateral triangle, an isosceles triangle, or an right-angled triangle having the base near the sealing portion and the apex near the wick) and trapezoids (an isosceles trapezoid having a side near the sealing portion longer than the side near the wick, and other trapezoids).

Figure 7:
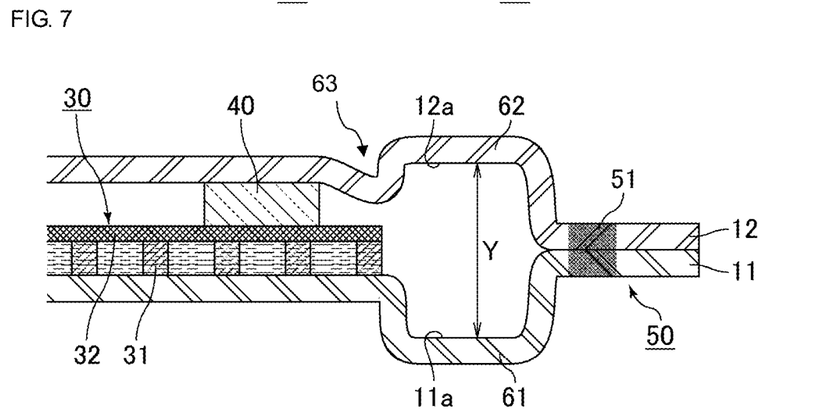
FIG. 7 is a schematic cross-sectional view of examples of a first sheet and a second sheet both including a groove.

FIG. 7 is a schematic cross-sectional view of examples of a first sheet and a second sheet both including a groove.

FIG. 7 illustrates a groove 61 formed in the first sheet 11 and a groove 62 formed in the second sheet 12. As shown in FIG. 7, a notch 63 is preferably formed in the second sheet 12 on a side of the groove 62 opposite the sealing portion 50, and preferably between the groove 62 and the first pillar 40 adjacent the groove 63. As can be seen with a comparison of FIG. 7 to FIG. 3, the notch 63 is formed due to the slope of the second sheet as it extends from the pillars 40 to the sealing portion 50.

This structure significantly expands the distance between the inner wall surface 11a of the first sheet 11 and the inner wall surface 12a of the second sheet 12 (distance denoted with double-pointed arrow Y in FIG. 7).

This structure thus allows the vapor chamber having grooves to preferably exert its effects.

FIG. 3 illustrates an example of a first sheet including grooves, and FIG. 7 illustrates an example of a first sheet and a second sheet both including grooves. However, only a second sheet may include grooves.

FIG. 7 illustrates a structure where the groove formed in the first sheet and the groove formed in the second sheet are positioned in the same cross section, that is, where both grooves are positioned to overlap each other when viewed in a plan. However, grooves formed in both the first sheet and the second sheet may be formed at different positions when viewed in a plan without overlapping each other.

In the vapor chamber according to the present invention, the wick and the groove are preferably located closer to the same one of the sheets when viewed in a cross section. The wick is disposed on the main surface of the first sheet opposing the second sheet. Thus, as illustrated in FIG. 3 or FIG. 7, a structure where the wick and the groove are both disposed closer to the first sheet than the second sheet is preferable.

Such a structure allows the working fluid to circulate more smoothly.

FIG. 4 illustrates an example where the groove extends to connect the wick and the welded portion to each other. However, the groove may be disposed at any portion between the wick and the welded portion.

Figure 8:
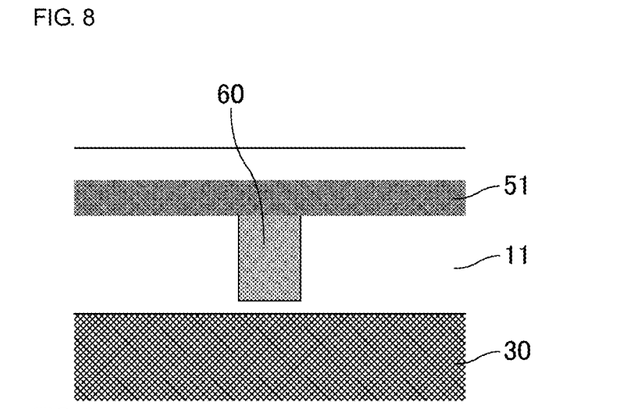
FIG. 8 is a schematic top view of another example of the position of a groove formed between the wick and a welded portion.
Figure 9:
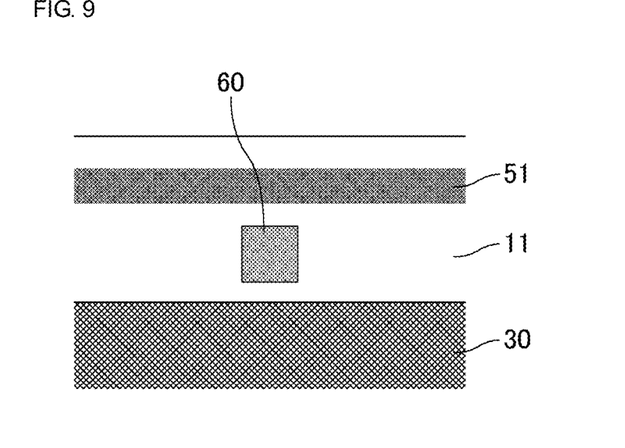
FIG. 9 is a schematic top view of another example of the position of a groove formed between the wick and the welded portion.

FIG. 8 and FIG. 9 are schematic top views of other examples of a groove formed at different positions between the wick and the welded portion.

FIG. 8 and FIG. 9 are each a top plan view illustrating only around a single groove to illustrate the positional relationship between the groove, the wick, and the welded portion.

FIG. 8 illustrates an example where the groove 60 is in contact with the welded portion 51 without being in contact with the wick 30. This example is a structure where the groove is in contact with the sealing portion when viewed in a cross section taken in the direction perpendicular to the direction in which the first sheet and the second sheet oppose each other.

The groove in contact with the welded portion without being in contact with the wick can reduce the capillary attraction at a portion of the outer edge of the housing at which the capillary attraction is more likely to be maximized. This structure can thus prevent reduction of the amount of the circulating working fluid.

FIG. 9 illustrates an example where the groove 60 is in contact with neither the welded portion 51 nor the wick 30. Also in this example, the capillary attraction is reduced at at least a portion where the groove is formed. Thus, compared to the structure not including grooves, this structure can reduce the amount of the working fluid held at a portion of the outer edge of the housing otherwise more likely to have higher capillary attraction, and thus can prevent reduction of the amount of the circulating working fluid.

In the vapor chamber according to the present invention, the shape of the housing is not limited to a particular one.

For example, the housing has a shape of a polygon such as a triangle or a quadrangle, a circle, an ellipse, or a combination of any of these, when viewed in a plan (viewed from above in FIG. 1).

In the vapor chamber according to the present invention, the first sheet and the second sheet constituting the housing may have end portions overlapping to be aligned or misaligned with each other.

In the vapor chamber according to the present invention, the first sheet and the second sheet may be made from any material having properties appropriate for the vapor chamber, such as thermal conductivity, strength, or flexibility. Preferable examples of the material used to form the first sheet and the second sheet include metal, such as copper, nickel, aluminum, magnesium, titanium, iron, and an alloy containing any of these as a main component. Particularly preferably, the first sheet and the second sheet are formed from copper.

In the vapor chamber according to the present invention, the first sheet and the second sheet may be formed from different materials. For example, the first sheet formed from a material having high strength can disperse the stress exerted on the housing. The first sheet and the second sheet formed from different materials can achieve different functions from both sheets. Although not particularly limited, examples of the above functions include a thermal conduction function and an electromagnetic shielding function.

In the vapor chamber according to the present invention, the first sheet and the second sheet may have any thickness, but the first sheet and the second sheet having an extremely small thickness may be easily deformed with low strength of the housing. Thus, the first sheet and the second sheet preferably have a thickness of equal to or greater than 20 μm, and more preferably, equal to or greater than 30 μm. The first sheet and the second sheet having an extremely large thickness prevent thickness reduction of the entire vapor chamber. Thus, the first sheet and the second sheet preferably have a thickness of equal to or smaller than 200 μm, more preferably, equal to or smaller than 150 μm, or more preferably, equal to or smaller than 100 μm. The first sheet and the second sheet may have the same thickness or different thicknesses.

When the projections forming the wick are integrated with the first sheet, the thickness of the first sheet refers to the thickness of a portion not in contact with the projections. When the pillars are integrated with the second sheet, the thickness of the second sheet refers to the thickness of a portion not in contact with the pillars.

In the vapor chamber according to the present invention, the thickness of the first sheet may be uniform or varied to have a thick portion and a thin portion. Similarly, the thickness of the second sheet may be uniform or varied to have a thick portion and a thin portion. The portion of the second sheet not in contact with the pillars may be recessed inward toward the housing.

In the vapor chamber according to the present invention, the working fluid may be any fluid that causes a change of phase between gas and liquid under the environments in the housing, such as water, an alcohol, or an alternative fluorocarbon. Preferably, the working fluid is preferably an aqueous compound, and more preferably, water.

In the vapor chamber according to the present invention, the wick may have any structure including a capillary structure that allows the working fluid to move with the capillary attraction. The capillary structure of the wick may be a known structure used in an existing vapor chamber. Examples of the capillary structure include a fine structure including projections and depressions such as pores, grooves, or protrusions. Examples of such a fine structure include a vesicular structure, a fibrous structure, a groove structure, and a meshwork structure.

In the vapor chamber according to the present invention, the wick is preferably disposed in the housing with an evaporation portion to a condensation portion disposed continuously. At least part of the wick may be integrated with the housing.

In the vapor chamber according to the present invention, the wick may include a mesh, nonwoven fabric, or a porous body on the surface opposite to the inner wall surface of the first sheet. For example, the wick may be formed from multiple projections arranged at predetermined intervals on the inner wall surface of the first sheet, and a mesh, nonwoven fabric, or a porous body disposed on the projections. Alternatively, the wick may be formed from a mesh, nonwoven fabric, or a porous body directly placed on the inner wall surface of the first sheet.

In the vapor chamber according to the present invention, when the wick includes multiple projections on the inner wall surface of the first sheet, the working fluid can be held between the projections, so that the vapor chamber can improve its heat transfer capacity.

Herein, the projections refer to portions having a larger height than the surrounding portion, and include, besides the portion protruding from the inner wall surface, a portion relatively raised by a recess, such as a groove, formed in the inner wall surface.

The projections may have any shape, such as a cylinder, a prism, a truncated cone, or a prismoid. The projections may have a wall shape, that is, a groove may be formed between adjacent projections.

In the vapor chamber according to the present invention, the pillars support the first sheet and the second sheet on the inner side. The pillars disposed on the inner side of the housing prevent the housing from being deformed when, for example, the housing is decompressed or receives external pressure from outside the housing. The pillars may support the first sheet or the second sheet directly or via another component such as a wick.

The pillars may have any shape, such as a cylinder, a prism, a truncated cone, or a prismoid.

The pillars may be arranged in any manner, but preferably, uniformly, for example, in a grid pattern at regular intervals. The uniformly arranged pillars secure uniform strength throughout the vapor chamber.

The vapor chamber according to the present invention is not limited to the above embodiments, but may be practically applied or modified in various manners within the scope of the present invention in terms of, for example, the structure or the manufacturing conditions of the vapor chamber.

For example, the vapor chamber according to the present invention may include a wick on the inner wall surface of the second sheet. Here, the pillars may support the second sheet via the wick without directly in contact with the second sheet.

As described above, the vapor chamber according to the present invention has high heat transfer capacity and high thermal diffusivity, and is thus preferably usable as a radiation device.

The vapor chamber according to the present invention is advantageous in size reduction, particularly, thickness reduction, and thus suitable for a device requiring size reduction, such as an electronic device.

A method for manufacturing a vapor chamber according to the present invention may be any method that can obtain the above structure. For example, a vapor chamber can be formed by overlapping each other the first sheet on which a wick disposed and a second sheet on which pillars are disposed, forming a groove with pressure exerted on the first sheet and/or the second sheet, filling a working fluid in the groove, and joining the first sheet and the second sheet together at a portion in contact with the groove.

The first sheet and the second sheet may be joined together in any method, for example, laser welding, resistance welding, diffusion bonding, brazing, soldering, tungsten-inert gas (TIG) welding, ultrasonic bonding, or plastic sealing. Among these, laser welding, resistance welding, brazing, or soldering is preferable.

REFERENCE SIGNS LIST 1 vapor chamber
10 housing
10a inner wall surface of housing
11 first sheet
11a main surface of first sheet opposing second sheet (inner wall surface of first sheet)
12 second sheet
12a main surface of second sheet opposing first sheet (inner wall surface of second sheet)
13 hollow
20 working fluid
30 wick
31 projection
32 mesh
40 pillar
50 sealing portion
51 welded portion
60, 61, 62 groove
70 heat generator

The invention claimed is:

1. A vapor chamber, comprising:
a housing including a first sheet and a second sheet opposing each other and having outer edges bonded to each other along a sealing portion;
a working fluid sealed in the housing; and
a wick disposed on a main internal surface of the first sheet opposing the second sheet,
wherein at least one of an inner wall surface of the first sheet and an inner wall surface of the second sheet includes at least one groove between the wick and the sealing portion when viewed in a cross section of the housing in a direction perpendicular to a direction in which the first sheet and the second sheet oppose each other such that a distance between the inner wall surface of the first sheet and the inner wall surface of the second sheet is widened at the at least one groove, and the groove is sized such that a capillary attraction for the working fluid is not increased in the groove.

2. The vapor chamber according to claim 1, wherein the first sheet and the second sheet comprise a metal material, and
wherein the sealing portion includes a welded portion where the first sheet and the second sheet are welded together, and the at least one groove is in contact with the sealing portion.

3. The vapor chamber according to claim 2, Wherein the at least one groove extends to connect the wick and the welded portion to each other.

4. The vapor chamber according to claim 1, wherein the wick and the groove are disposed closer to the first sheet than the second sheet viewed in a cross section of the vapor chamber.

5. The vapor chamber according to claim 1, wherein a ratio of a width to a depth of the at least one groove is within a range of 0.5 to 10.0.

6. The vapor chamber according to claim 1, wherein a width of the at least one groove is within a range of 500 μm to 700 μm.

7. The vapor chamber according to claim 6, wherein a length of the at least one groove is within a range of 300 μm to 3000 μm.

8. The vapor chamber according to claim 1, wherein a length of the at least one groove is within a range of 300 μm to 3000 μm.

9. The vapor chamber according to claim 1, wherein a depth of the at least one groove is within a range of 100 μm to 1000 μm.

10. The vapor chamber according to claim 6, wherein a depth of the at least one groove is within a range of 100 μm to 1000 μm.

11. The vapor chamber according to claim 1, wherein the at least one groove is a plurality of grooves that are spaced apart around a perimeter of the wick.

12. The vapor chamber according to claim 1, wherein the at least one groove is shaped such that a width thereof reduces from the sealing portion towards the wick in a plan view of the vapor chamber.

13. The vapor chamber according to claim 1, wherein the at least one groove is at least one first groove included in the first sheet, and the vapor chamber further comprises at least one second groove included in the second sheet.

14. The vapor chamber according to claim 13, further comprising a notch in the second sheet on a side of the at least one second groove opposite the sealing portion.

15. A vapor chamber, comprising:
a housing including a first sheet and a second sheet opposing each other and having outer edges bonded to each other along a sealing portion:
a working fluid sealed in the housing;
a wick disposed on a main internal surface of the first sheet opposing the second sheet,
wherein the first sheet includes at least one first groove between the wick and the sealing portion when viewed in a cross section of the housing in a direction perpendicular to a direction in which the first sheet and the second sheet oppose each other,
wherein the second sheet includes at least one second groove,
wherein a respective one of the at least one first groove overlaps a respective one of the at least one second groove in a plan view of the vapor chamber, and
a notch in the second sheet on a side of the at least one second groove opposite the sealing portion.

16. The vapor chamber according to claim 13, wherein a respective one of the at least one first groove overlaps a respective one of the at least one second groove in a plan view of the vapor chamber.

17. The vapor chamber according to claim 1, wherein the at least one groove is included in the second sheet.

18. The vapor chamber according to claim 17, further comprising a notch in the second sheet on a side of the groove opposite the sealing portion.

19. The vapor chamber according to claim 2, wherein the at least one groove is in contact with the welded portion and not in contact with the wick.

20. The vapor chamber according to claim 2, wherein the at least one groove is not in contact with the welded portion and not in contact with the wick.

* * * * *